United States Patent
An et al.

(10) Patent No.: US 11,063,065 B2
(45) Date of Patent: Jul. 13, 2021

(54) SEMICONDUCTOR DEVICE HAVING A NEGATIVE CAPACITANCE USING FERROELECTRICAL MATERIAL

(71) Applicant: SAMSUNG ELECTRONICS CO., LTD., Suwon-si (KR)

(72) Inventors: Guk Il An, Goyang-si (KR); Keun Hwi Cho, Seoul (KR); Sung Min Kim, Incheon (KR); Yoon Moon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 54 days.

(21) Appl. No.: 16/454,532

(22) Filed: Jun. 27, 2019

(65) Prior Publication Data

US 2020/0013784 A1   Jan. 9, 2020

(30) Foreign Application Priority Data

Jul. 6, 2018  (KR) .................. 10-2018-0078743
Jan. 7, 2019  (KR) .................. 10-2019-0001700

(51) Int. Cl.
*H01L 27/1159*   (2017.01)
*H01L 27/11592*  (2017.01)

(52) U.S. Cl.
CPC .... *H01L 27/1159* (2013.01); *H01L 27/11592* (2013.01)

(58) Field of Classification Search
CPC .................. H01L 27/1159; H01L 27/11592
See application file for complete search history.

(56) References Cited

U.S. PATENT DOCUMENTS

| | | | |
|---|---|---|---|
| 6,197,668 B1 | 3/2001 | Gardner et al. | |
| 7,253,123 B2 | 8/2007 | Arghavani et al. | |
| 9,041,082 B2 | 5/2015 | Dubourdieu et al. | |
| 9,349,842 B2 | 5/2016 | Schloesser et al. | |
| 9,484,924 B2 | 11/2016 | Shin et al. | |
| 10,068,901 B2* | 9/2018 | Kim | H01L 29/4966 |
| 10,068,904 B2* | 9/2018 | Kim | H01L 21/823857 |
| 10,431,583 B2* | 10/2019 | Kim | H01L 29/66795 |
| 2016/0336315 A1* | 11/2016 | You | H01L 29/42364 |
| 2017/0162702 A1 | 6/2017 | Hu | |
| 2018/0277544 A1* | 9/2018 | Chang | H01L 29/4238 |
| 2018/0301383 A1* | 10/2018 | Kim | H01L 29/78 |
| 2018/0315661 A1* | 11/2018 | Chuang | H01L 27/0928 |

(Continued)

FOREIGN PATENT DOCUMENTS

KR   10-1576507   12/2015

*Primary Examiner* — Ida M Soward
(74) *Attorney, Agent, or Firm* — F. Chau & Associates, LLC

(57) ABSTRACT

A semiconductor device includes: a substrate including a first region and a second region; a first interfacial layer disposed on the substrate in the first region and having a first thickness; a second interfacial layer disposed on the substrate in the second region, wherein the second interfacial layer includes a second thickness that is smaller than the first thickness; a first gate insulating layer disposed on the first interfacial layer and including a first ferroelectric material layer; a second gate insulating layer disposed on the second interfacial layer; a first gate electrode disposed on the first gate insulating layer; and a second gate electrode disposed on the second gate insulating layer.

19 Claims, 12 Drawing Sheets

(56) References Cited

U.S. PATENT DOCUMENTS

2019/0326284 A1\* 10/2019 Kim .................... H01L 29/7848
2020/0006558 A1\* 1/2020 Wu .................... H01L 21/02282
2020/0135577 A1\* 4/2020 Yeh .................... H01L 21/02356

\* cited by examiner

SEMICONDUCTOR DEVICE HAVING A NEGATIVE CAPACITANCE USING FERROELECTRICAL MATERIAL

CROSS-REFERENCE TO RELATED APPLICATION

This application claims priority under 35 U.S.C. § 119 to Korean Patent Application No. 10-2018-0078743 filed on Jul. 6, 2018 and Korean Patent Application No. 10-2019-0001700 filed on Jan. 7, 2019 in the Korean Intellectual Property Office, the disclosures of which are incorporated by reference herein in their entireties.

TECHNICAL FIELD

The present inventive concept relates to a semiconductor device, and more particularly, to a semiconductor device including a transistor having a negative capacitance (NC) using a ferroelectric material.

DISCUSSION OF THE RELATED ART

After the development of metal-oxide-semiconductor field-effect transistors (MOSFET), the degree of integration of integrated circuits has continued to increase. For example, the degree of integration of integrated circuits, e.g., the total number of transistors per unit chip area, has doubled every two years. To increase the degree of integration of integrated circuits, the size of individual transistors has been continuously decreasing. In addition, semiconductor techniques have emerged to increase the performance of miniaturized transistors.

Such semiconductor techniques may include a high-k metal gate (HKMG) technique for improving gate capacitance and reducing leakage current, and a Fin Field Effect Transistor (FET) technique that can decrease a short channel effect (SCE) in which the potential of a channel region is affected by a drain voltage.

However, in comparison with the miniaturization of the size of transistors, the low driving voltage of transistors has not increased as much. Accordingly, the power density of complementary metal-oxide-semiconductor (CMOS) transistors is increasing exponentially. To reduce the power density, the driving voltage may be lowered. However, because silicon-based MOSFETs have physical operating characteristics based on heat dissipation, it may be difficult to achieve a very low supply voltage.

SUMMARY

According to an exemplary embodiment of the present inventive concept, a semiconductor device includes: a substrate including a first region and a second region; a first interfacial layer disposed on the substrate in the first region and having a first thickness; a second interfacial layer disposed on the substrate in the second region, wherein the second interfacial layer includes a second thickness that is smaller than the first thickness; a first gate insulating layer disposed on the first interfacial layer and including a first ferroelectric material layer; a second gate insulating layer disposed on the second interfacial layer; a first gate electrode disposed on the first gate insulating layer; and a second gate electrode disposed on the second gate insulating layer.

According to an exemplary embodiment of the present inventive concept, a semiconductor device includes: a substrate including a first region and a second region; a first gate structure disposed on the substrate in the first region, wherein the first gate structure includes a first gate stack having a first width and a first gate spacer disposed on a sidewall of the first gate stack, wherein the first gate stack includes a first gate insulating layer including a first ferroelectric material layer; and a second gate structure disposed on the substrate in the second region, wherein the second gate structure includes a second gate stack having a second width that is smaller than the first width and a second gate spacer disposed on a sidewall of the second gate stack.

According to an exemplary embodiment of the present inventive concept, a semiconductor device includes: a substrate including an input/output(I/O) region and a logic region; a first negative capacitance field-effect transistor (NCFET) formed in the I/O region and including a first ferroelectric material layer; and a first transistor formed in the logic region and including a first gate insulating layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Although the drawings relating to a semiconductor device according to an exemplary embodiment of the present inventive concept illustrate a fin-type transistor (FinFET) or a planar transistor including a channel region having a fin-shaped pattern, the present inventive concept is not limited thereto. A semiconductor device according to an exemplary embodiment of the present inventive concept may be applied to a transistor including nanowires, a transistor including nanosheets or a three-dimensional (3D) transistor. Further, a semiconductor device according to an exemplary embodiment of the present inventive concept may be applied to a planar transistor.

Figure 1:
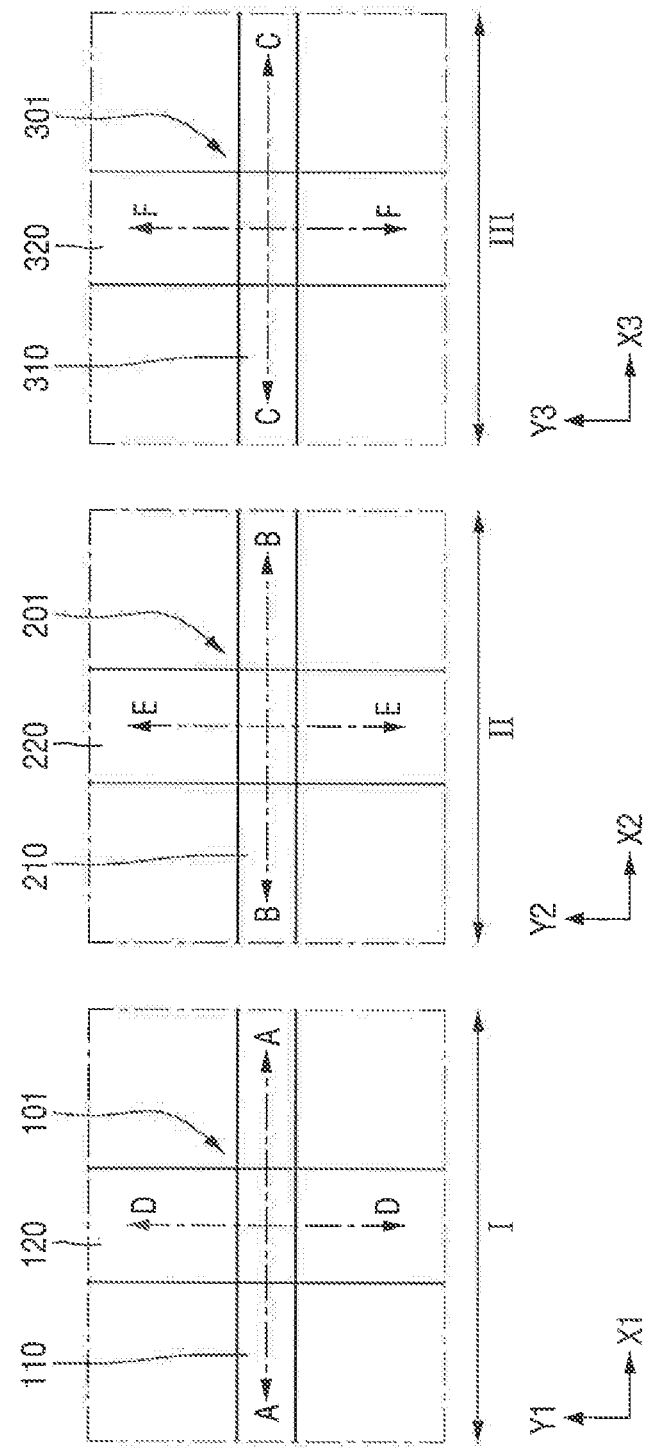
FIG. 1 is a layout diagram illustrating a semiconductor device according to an exemplary embodiment of the present inventive concept.
Figure 2:
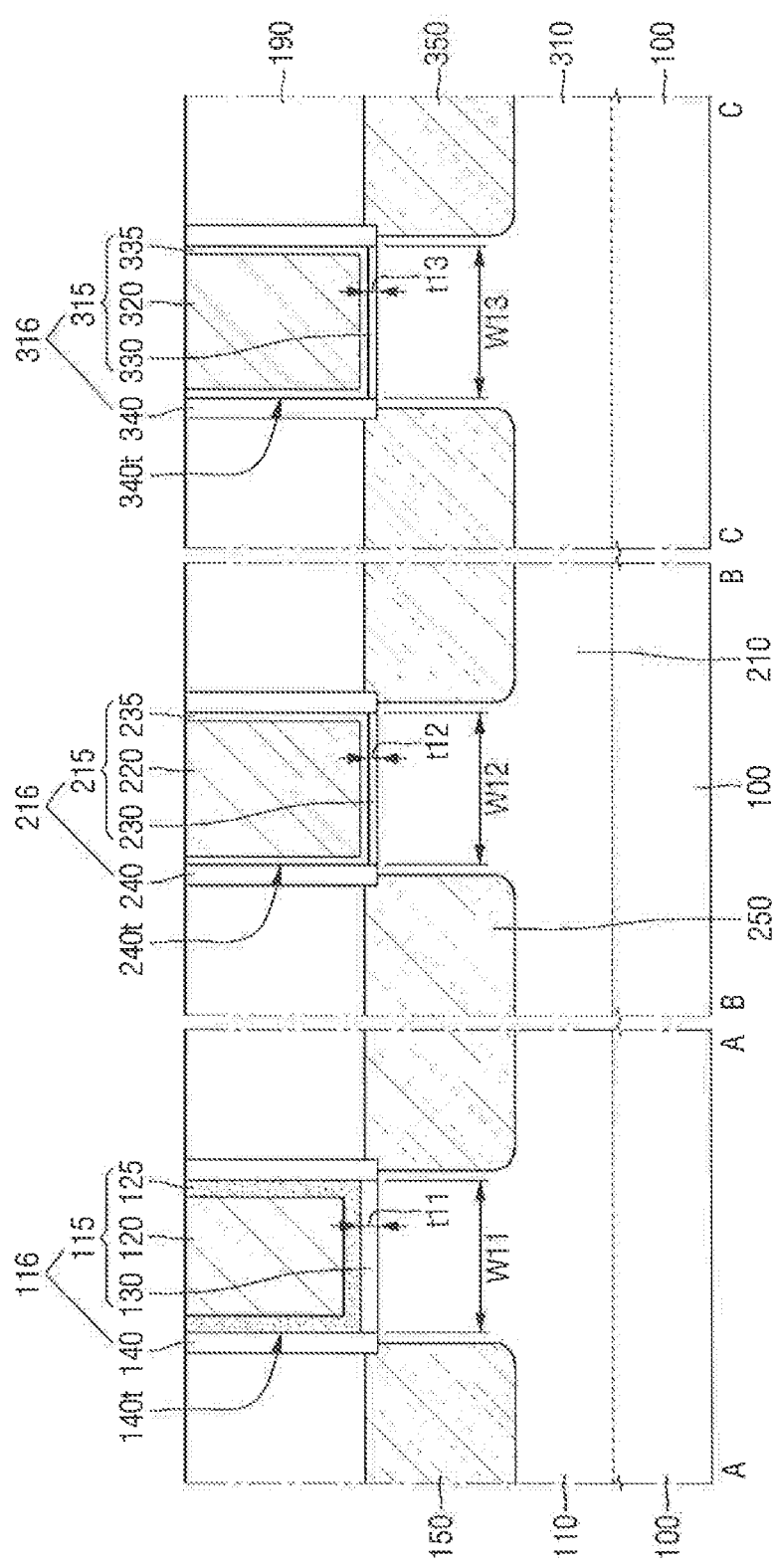
FIG. 2 shows cross-sectional views taken along lines A-A, B-B and C-C of FIG. 1 according to an exemplary embodiment of the present inventive concept.
Figure 3:
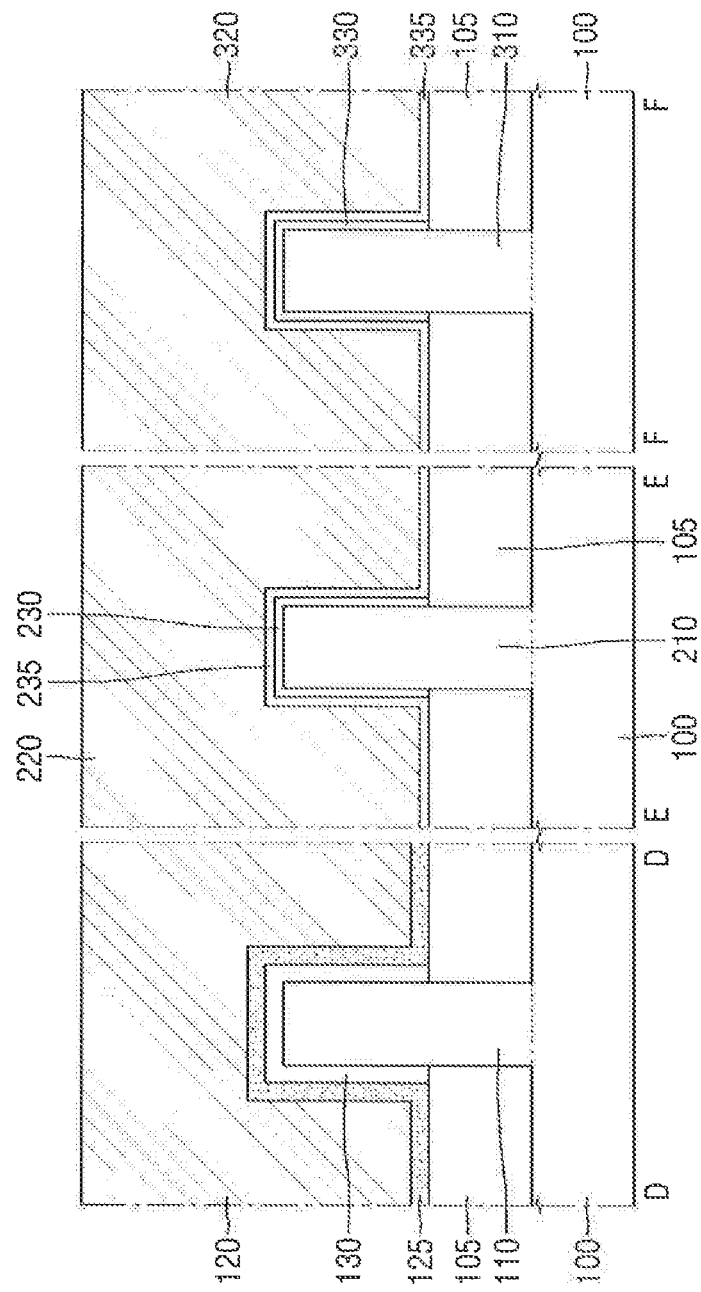
FIG. 3 shows cross-sectional views taken along lines D-D, E-E and F-F of FIG. 1 according to an exemplary embodiment of the present inventive concept.

FIG. 1 is a layout diagram illustrating a semiconductor device according to an exemplary embodiment of the present inventive concept. FIG. 2 shows cross-sectional views taken along lines A-A, B-B and C-C of FIG. 1 according to an exemplary embodiment of the present inventive concept. FIG. 3 shows cross-sectional views taken along lines D-D, E-E and F-F of FIG. 1 according to an exemplary embodiment of the present inventive concept.

Referring to FIGS. 1 to 3, a semiconductor device according to an exemplary embodiment of the present inventive concept includes a first transistor 101, a second transistor 201 and a third transistor 301 formed on a substrate 100.

The substrate 100 may include first, second and third regions I, II and III.

For example, the first region I of the substrate 100 may be an input/output (I/O) region, the second region II of the substrate 100 may be a logic region, and the third region III of the substrate 100 may be a memory region, e.g., a static random access memory (SRAM) region.

In an example, the first region I of the substrate 100 is an I/O region, and the second region II and the third region III of the substrate 100 may be logic regions. The second region II and the third region III of the substrate 100 may be regions where transistors of different conductivity types are formed.

For example, the substrate 100 may be bulk silicon or silicon-on-insulator (SOI). In addition, the substrate 100 may be a silicon substrate or may include other materials such as silicon germanium, silicon germanium on insulator (SGOI), indium antimonide, a lead tellurium compound, indium arsenide, indium phosphide, gallium arsenide, and/or gallium antimonide, but the present inventive concept is not limited thereto.

The first transistor 101 may be formed in the first region I of the substrate 100, the second transistor 201 may be formed in the second region II of the substrate 100, and the third transistor 301 may be formed in the third region III of the substrate 100. Each of the first transistor 101, the second transistor 201 and the third transistor 301 may be a fin-type transistor (finFET) using a three-dimensional channel.

The first transistor 101 may be formed in a region where a first fin-shaped pattern 110 extending in a first direction X1 and a first gate electrode 120 extending in a second direction Y1 intersect with each other. The second transistor 201 may be formed in a region where a second fin-shaped pattern 210 extending in a third direction X2 and a second gate electrode 220 extending in a fourth direction Y2 intersect with each other. The third transistor 301 may be formed in a region where a third fin-shaped pattern 310 extending in a fifth direction X3 and a third gate electrode 320 extending in a sixth direction Y3 intersect with each other.

In the semiconductor device according to an exemplary embodiment of the present inventive concept, the first transistor 101 may be a negative capacitance (NC) LET using a negative capacitor. Each of the second transistor 201 and the third transistor 301 might not be an NCFET.

Here, a negative capacitor is a capacitor having a negative capacitance, and the capacitance can be increased by connecting a negative capacitor in series with a positive capacitor.

The first transistor 101, which is an NCFET, may include an insulating layer having ferroelectric characteristics. The first transistor 101 may have a subthreshold swing (SS) below about 60 mV/decade at about room temperature.

The first transistor 101 may include the first fin-shaped pattern 110, a first gate structure 116 and a first source/drain region 150. The first gate structure 116 may include a first gate spacer 140 and a first gate stack 115. The first gate stack 115 may include a first interfacial layer 130, a first ferroelectric material layer 125 and the first gate electrode 120.

The second transistor 201 may include the second fin-shaped pattern 210, a second gate structure 216 and a second source/drain region 250. The second gate structure 216 may include a second gate spacer 240 and a second gate stack 215. The second gate stack 215 may include a second interfacial layer 230, a second high dielectric constant (high-k) insulating layer 235 and the second gate electrode 220. For example, a high-k may be a dielectric constant that is at least as high as that of silicon oxide.

The third transistor 301 may include the third fin-shaped pattern 310, a third gate structure 316 and a third source/drain region 350. The third gate structure 316 may include a third gate spacer 340 and a third gate stack 315. The third gate stack 315 may include a third interfacial layer 330, a third high-k insulating layer 335 and the third gate electrode 320.

The first to third fin-shaped patterns 110, 210 and 310 may be formed on the substrate 100. For example, the first to third fin-shaped patterns 110, 210 and 310 may protrude from the substrate 100.

The first to third fin-shaped patterns 110, 210 and 310 may be a part of the substrate 100 or may include an epitaxial layer grown from the substrate 100. Each of the first to third fin-shaped patterns 110, 210 and 310 may include silicon and/or germanium, which is a semiconductor material. Each of the first to third fin-shaped patterns 110, 210 and 310 may include a compound semiconductor and may include, for example, a group IV-IV compound semiconductor or a group III-V compound semiconductor.

The group IV-IV compound semiconductor may be, for example, a binary compound or a ternary compound including at least two of carbon (C), silicon (Si), germanium (Ge) and tin (Sn), and/or a compound obtained by doping the above-mentioned compound with group IV elements. The group III-V compound semiconductor may be, for example, a binary compound, a ternary compound or a quarternary compound formed by combining at least one of aluminum (Al), gallium (Ga) and indium (In) which are group III elements with one of phosphorus (P), arsenic (As) and antimonium (Sb) which are group V elements.

A field insulating layer 105 may be formed on the substrate 100. The field insulating layer 105 may be disposed on at least a part of the sidewalls of the first to third fin-shaped patterns 110, 210 and 310.

The upper surfaces of the first to third fin-shaped patterns 110, 210 and 310 may protrude upward from the upper surface of the field insulating layer 105. The field insulating layer 105 may include at least one of, for example, a silicon oxide layer, a silicon nitride layer and a silicon oxynitride layer.

An interlayer insulating layer 190 may be disposed on the substrate 100. First to third gate trenches 140t, 240t and 340t may be formed in the interlayer insulating layer 190.

The first gate trench 140t may be formed by the first gate spacer 140. For example, the first gate spacer 140 may be side surfaces of the first gate trench 140t. The second gate trench 240t may be formed by the second gate spacer 240. The third gate trench 340t may be formed by the third gate spacer 340.

Each of the first to third gate spacers 140, 240 and 340 may include, for example, at least one of silicon nitride (SiN), silicon oxynitride (SiON), silicon oxide (SiO$_2$) and silicon oxycarbonitride (SiOCN).

The interlayer insulating layer 190 may include, for example, silicon oxide, silicon nitride, silicon oxynitride, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCE), SILK, polyimide, a porous polymeric material, or a combination thereof. However, the present inventive concept is not limited thereto.

The first gate stack 115 may be formed in the first gate trench 140t. The second gate stack 215 may be formed in the second gate trench 240t. The third gate stack 315 may be formed in the third gate trench 340t. The first to third gate spacers 140, 240 and 340 may be formed on the sidewalls of the first to third gate stacks 115, 215 and 315, respectively.

The first to third gate stacks 115, 215 and 315 may fill the first to third gate trenches 140t, 240t and 340t, respectively. For example, the first to third gate stacks 115, 215 and 315 may entirely fill the first to third gate trenches 140t, 240t and 340t, respectively. Although the upper surfaces of the first to third gate stacks 115, 215 and 315 are shown as being flush with the upper surface of the interlayer insulating layer 190, the present inventive concept is not limited thereto. For example, the upper surfaces of the first to third gate stacks 115, 215 and 315 may be below the upper surface of the interlayer insulating layer 190 or may protrude beyond the upper surface of the interlayer insulating layer 190.

In addition, a capping pattern may be formed on the first to third gate stacks 115, 215 and 315 to fill a part of the first to third gate trenches 140t, 240t and 340t, respectively. In this case, the upper surface of the capping pattern may be flush with the upper surface of the interlayer insulating layer 190. However, the present inventive concept is not limited thereto.

In the semiconductor device according to an exemplary embodiment of the present inventive concept, a width W11 of the first gate stack 115 in the first direction X1, a width W12 of the second gate stack 215 in the third direction X2 and a width W13 of the third gate stack 315 in the fifth direction X3 may be substantially the same.

The first interfacial layer 130 may be formed on the substrate 100. For example, the first interfacial layer 130 may be formed on the first fin-shaped pattern 110.

The first interfacial layer 130 may be formed in the first gate trench 140t. For example, the first interfacial layer 130 may be formed along the bottom surface of the first gate trench 140t.

The first ferroelectric material layer 125 may be formed on the first interfacial layer 130. For example, the first ferroelectric material layer 125 may be in contact with the first interfacial layer 130.

The first ferroelectric material layer 125 may be formed along the inner wall of the first gate trench 140t. For example, the first ferroelectric material layer 125 may be formed along the sidewalls and the bottom surface of the first gate trench 140t. For example, the first ferroelectric material layer 125 may be in contact with the first gate spacer 140.

The first ferroelectric material layer 125 may have ferroelectric characteristics. The first ferroelectric material layer 125 may be thick enough to have ferroelectric characteristics. The first ferroelectric material layer 125 may have a thickness of, for example, about 3 to about 10 nm, but the present inventive concept is not limited thereto. Since a thickness at which each ferroelectric material exhibits ferroelectric characteristics may be different, the thickness of the first ferroelectric material layer 125 may vary depending on the ferroelectric material.

At least one of the first interfacial layer 130 or the first ferroelectric material layer 125 may be a gate insulating layer of the first transistor 101. The gate insulating layer of the first transistor 101 may have ferroelectric characteristics.

The second interfacial layer 230 may be formed on the substrate 100. For example, the second interfacial layer 230 may be formed on the second fin-shaped pattern 210.

The second interfacial layer 230 may be formed in the second gate trench 240t. For example, the second interfacial layer 230 may be formed along the bottom surface of the second gate trench 240t.

The second high-k insulating layer 235 may be formed on the second interfacial layer 230. For example, the second high-k insulating layer 235 may be in contact with the second interfacial layer 230.

The second high-k insulating layer 235 may be formed along the inner wall of the second gate trench 240t. For example, the second high-k insulating layer 235 may be formed along the sidewalls and the bottom surface of the second gate trench 240t. For example, the second high-k insulating layer 235 may be in contact with the second gate spacer 240. The second high-k insulating layer 235 might not have ferroelectric characteristics.

At least one of the second interfacial layer 230 or the second high-k insulating layer 235 may be a gate insulating layer of the second transistor 201. The gate insulating layer of the second transistor 201 might not have ferroelectric characteristics.

The third interfacial layer 330 may be formed on the substrate 100. For example, the third interfacial layer 330 may be formed on the third fin-shaped pattern 310.

The third interfacial layer 330 may be formed in the third gate trench 340t. The third interfacial layer 330 may be formed along the bottom surface of the third gate trench 340t.

The third high-k insulating layer 335 may be formed on the third interfacial layer 330. The third high-k insulating layer 335 may be in contact with the third interfacial layer 330.

The third high-k insulating layer 335 may be formed along the inner wall of the third gate trench 340t. For example, the third high-k insulating layer 335 may be formed along the sidewalls and the bottom surface of the third gate trench 340t. For example, the third high-k insulating layer 335 may be in contact with the third gate spacer 340. The third high-k insulating layer 335 might not have ferroelectric characteristics.

Each of the third interfacial layer 330 and the third high-k insulating layer 335 may be a gate insulating layer of the third transistor 301. The gate insulating layer of the third transistor 301 might not have ferroelectric characteristics.

In a semiconductor device according to an exemplary embodiment of the present inventive concept, a thickness t11 of the first interfacial layer 130 is greater than a thickness t12 of the second interfacial layer 230 and a thickness t13 of the third interfacial layer 330.

Although it is illustrated that the first to third interfacial layers 130, 230 and 330 are formed only on the bottom surfaces of the first to third gate trenches 140t, 240t and 340t, respectively, the present inventive concept is not limited thereto. According to the manufacturing method, the first to third interfacial layers 130, 230 and 330 may be formed on the sidewalk of the first to third gate trenches 140t, 240t and 340t, respectively. Depending on the manufacturing method, each of the first to third interfacial layers 130, 230 and 330 may be disposed on the upper surface of the field insulating layer 105. For example, each of the first to third interfacial layers 130, 230 and 330 may extend along the upper surface of the field insulating layer 105.

For example, each of the first to third interfacial layers 130, 230 and 330 may include a silicon oxide layer.

The first ferroelectric material layer 125 may include, for example, at least one of hafnium oxide, hafnium zirconium oxide, zirconium oxide, barium strontium titanium oxide, barium titanium oxide and/or lead zirconium titanium oxide. Here, the hafnium zirconium oxide may be obtained by doping hafnium oxide with zirconium (Zr), or may be a compound of hafnium (Hf), zirconium (Zr) and oxygen (O).

The first ferroelectric material layer 125 may further include a doping element doped with the above-mentioned material. The doping element may be at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn).

Each of the second and third high-k insulating layers 235 and 335 may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

In an exemplary embodiment of the present inventive concept, each of the second and third high-k insulating layers 235 and 335 may include the same material as the first ferroelectric material layer 125, The second and third high-k insulating layers 235 and 335 might not have ferroelectric characteristics even though each of the second and third high-k insulating layers 235 and 335 includes the same material as the first ferroelectric material layer 125. In this case, the thickness of each of the second and third high-k insulating layers 235 and 335 may be smaller than the thickness of the first ferroelectric material layer 125.

The first gate electrode 120 may be formed on the first ferroelectric material layer 125. The first gate electrode 120 may be disposed in the first gate trench 140t.

The second gate electrode 220 may be formed on the second high-k insulating layer 235, The second gate electrode 220 may be disposed in the second gate trench 240t.

The third gate electrode 320 may be formed on the third high-k insulating layer 335. The third gate electrode 320 may be disposed in the third gate trench 340t.

The first to third gate electrodes 120, 220 and 320 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TIC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and/or a combination thereof.

The first source/drain region 150 may be formed on at least one side of the first gate structure 116. The second source/drain region 250 may be formed on at least one side of the second gate structure 216. The third source/drain region 350 may be formed on at least one side of the third gate structure 316.

For example, the first to third source/drain regions 150, 250 and 350 may include an epitaxial pattern formed on the first to third fin-shaped patterns 110, 210 and 310, respectively.

Figure 4:
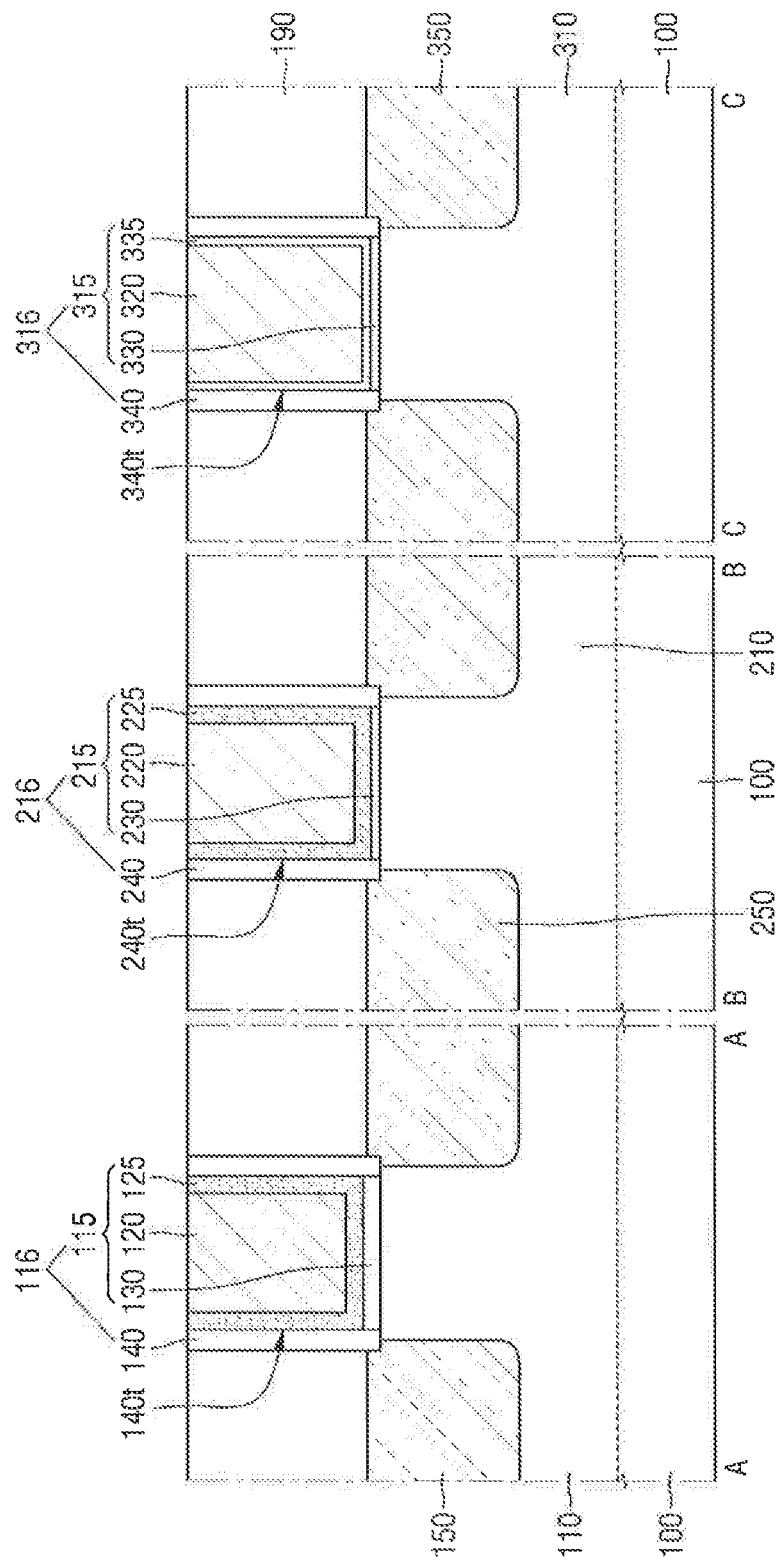
FIG. 4 is a diagram illustrating a semiconductor device according to an exemplary embodiment of the present inventive concept.

FIG. 4 is a diagram illustrating a semiconductor device according to an exemplary embodiment of the present inventive. For simplicity of description, the following description will focus on differences from the description with reference to FIGS. 1 to 3, and thus any description that is redundant may be omitted.

Referring to FIG. 4, in a semiconductor device according to an exemplary embodiment of the present inventive concept, the second gate stack 215 may include a second ferroelectric material layer 225.

The second gate stack 215 may include the second ferroelectric material layer 225 instead of the second high-k insulating layer 235. The second transistor 201 including the second gate stack 215 that includes the second ferroelectric material layer 225 may be an NCFET.

The second ferroelectric material layer 225 may be formed on the second interfacial layer 230. For example, the second ferroelectric material layer 225 may be in contact with the second interfacial layer 230.

The second ferroelectric material layer 225 may be formed along the inner wall of the second gate trench 240t. For example, the second ferroelectric material layer 225 may be formed along the sidewalls and the bottom surface of the second gate trench 240t. For example, the second ferroelectric material layer 225 may be in contact with the second gate spacer 240.

The second ferroelectric material layer 225 may have ferroelectric characteristics. The second ferroelectric material layer 225 may be thick enough to have ferroelectric characteristics.

Each of the second interfacial layer 230 and the second ferroelectric material layer 225 may be a gate insulating layer of the second transistor 201. The gate insulating layer of the second transistor 201 may have ferroelectric characteristics.

The first transistor 101 of the first region I and the second transistor 201 of the second region II may perform different functions. For example, the first transistor 101 may be formed in the I/O region, and the second transistor 201 may be formed in the logic region.

For example, the first ferroelectric material layer 125 included in the first transistor 101 formed in the I/O region may include a ferroelectric material having suitable on-current characteristics. The second ferroelectric material layer 225 included in the second transistor 201 formed in the logic region may include a ferroelectric material having suitable subthreshold swing characteristics.

For example, when the NCFETs are respectively formed in the regions having different functions, the ferroelectric material layers included in the respective NCFETs may include different materials from each other. For example, the first ferroelectric material layer 125 may include material that is different from that of the second ferroelectric material layer 225.

Figure 5:
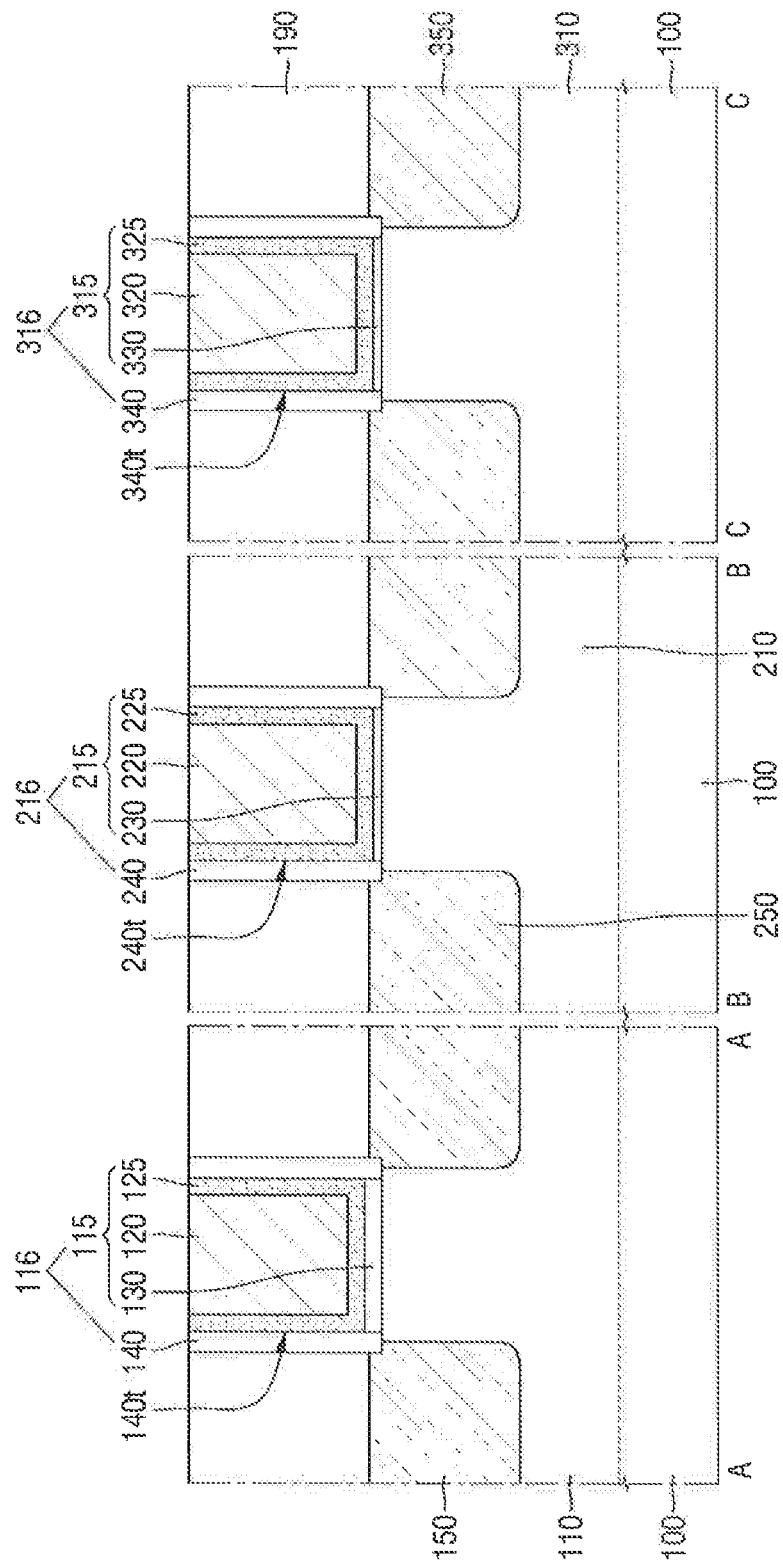
FIG. 5 is a diagram illustrating a semiconductor device according to an exemplary embodiment of the present inventive concept.

FIG. 5 is a diagram illustrating a semiconductor device according to an exemplary embodiment of the present inventive concept. For simplicity of description, the following description will focus on differences from the description with reference to FIG. 4, and thus any description that is redundant may be omitted.

Referring to FIG. 5, in a semiconductor device according to an exemplary embodiment of the present inventive concept, the third gate stack 315 may include a third ferroelectric material layer 325.

The third gate stack 315 may include the third ferroelectric material layer 325 instead of the third high-k insulating layer 335. The third transistor 301 including the third gate stack 315 that includes the third ferroelectric material layer 325 may be an NCFET.

The third ferroelectric material layer 325 may be formed on the third interfacial layer 330. The third ferroelectric material layer 325 may be in contact with the third interfacial layer 330.

The third ferroelectric material layer 325 may be formed along the inner wall of the third gate trench 340t. For example, the third ferroelectric material layer 325 may be formed along the sidewalls and the bottom surface of the third gate trench 340t. For example, the third ferroelectric material layer 325 may be in contact with the third gate spacer 340.

The third ferroelectric material layer 325 may have ferroelectric characteristics. The third ferroelectric material layer 325 may be thick enough to have ferroelectric characteristics.

Each of the third interfacial layer 330 and the third ferroelectric material layer 325 may be a gate insulating layer of the third transistor 301. The gate insulating layer of the third transistor 301 may have ferroelectric characteristics.

Figure 6:
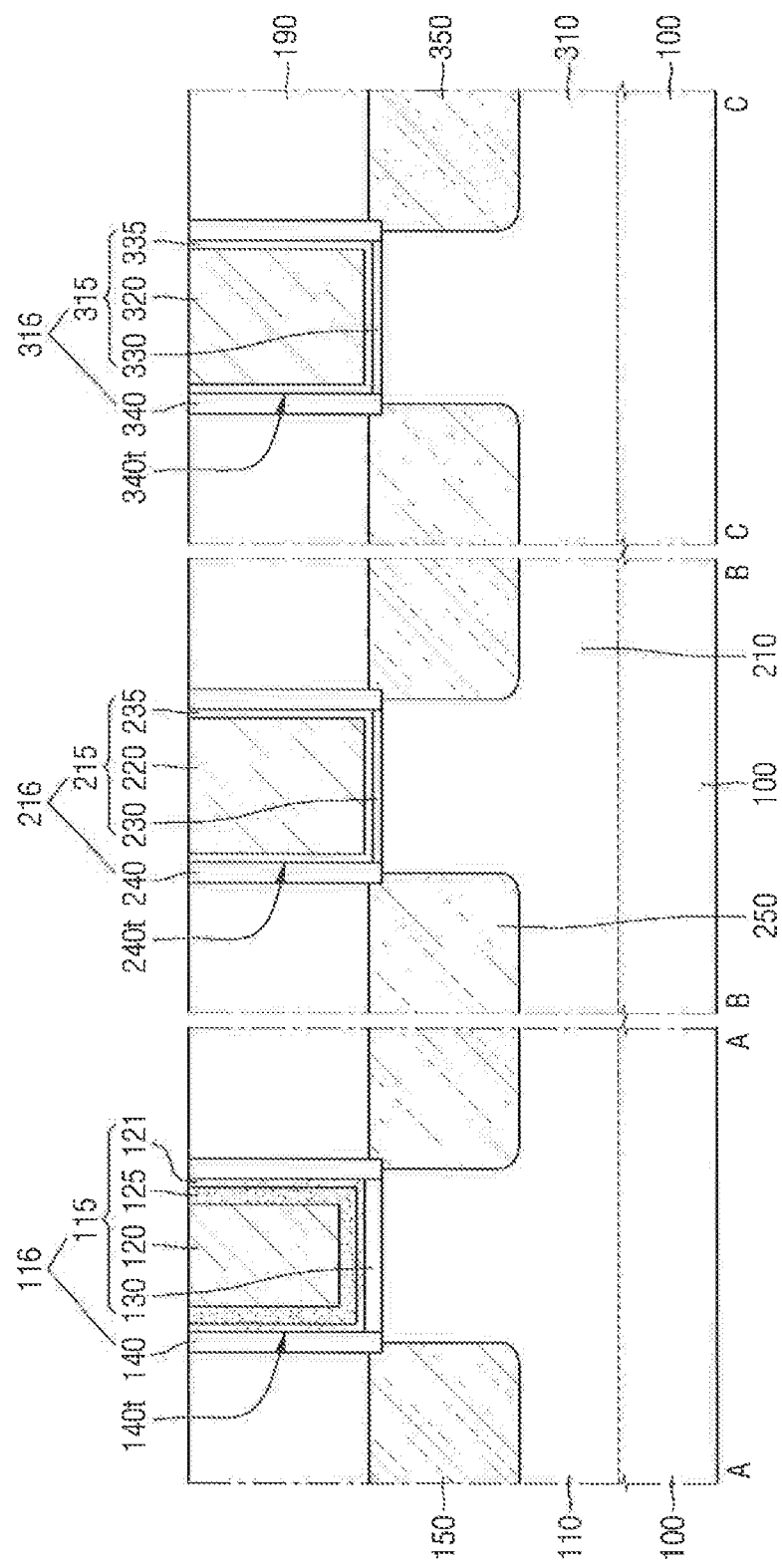
FIG. 6 is a diagram illustrating a semiconductor device according to an exemplary embodiment of the present inventive concept.

FIG. 6 is a diagram illustrating a semiconductor device according to an exemplary embodiment of the present inventive concept. For simplicity of description, the following description will focus on differences from the description with reference to FIGS. 1 to 3, and thus any description that is redundant may be omitted.

Referring to FIG. 6, in a semiconductor device according to an exemplary embodiment of the present inventive concept, the first gate stack 115 may further include a first interposing conductive layer 121.

The first gate stack 115 may include a first interfacial layer 130, a first interposing conductive layer 121, a first ferroelectric material layer 125 and a first gate electrode 120.

The first interposing conductive layer 121 may be formed on the first interfacial layer 130. The first interposing conductive layer 121 may be formed along the sidewalls and the bottom surface of the first gate trench 140t. For example, the first interposing conductive layer 121 may be disposed between the first gate spacer 140 and the first ferroelectric material layer 125.

The first ferroelectric material layer 125 may be formed on the first interposing conductive layer 121. For example, the first ferroelectric material layer 125 may be formed along the profile of the first interposing conductive layer 121. For example, the first ferroelectric material layer 125 may be formed on inner sidewalk and an inner lower surface of the first interposing conductive layer 121.

The first interposing conductive layer 121 may include, for example, at least one of the following: a metal, at least two metal alloys, metal nitride, metal silicide, metal carbide, metal carbonitride, nitride of a metal alloy, carbonitride of a metal alloy and/or doped polysilicon.

Figure 7:
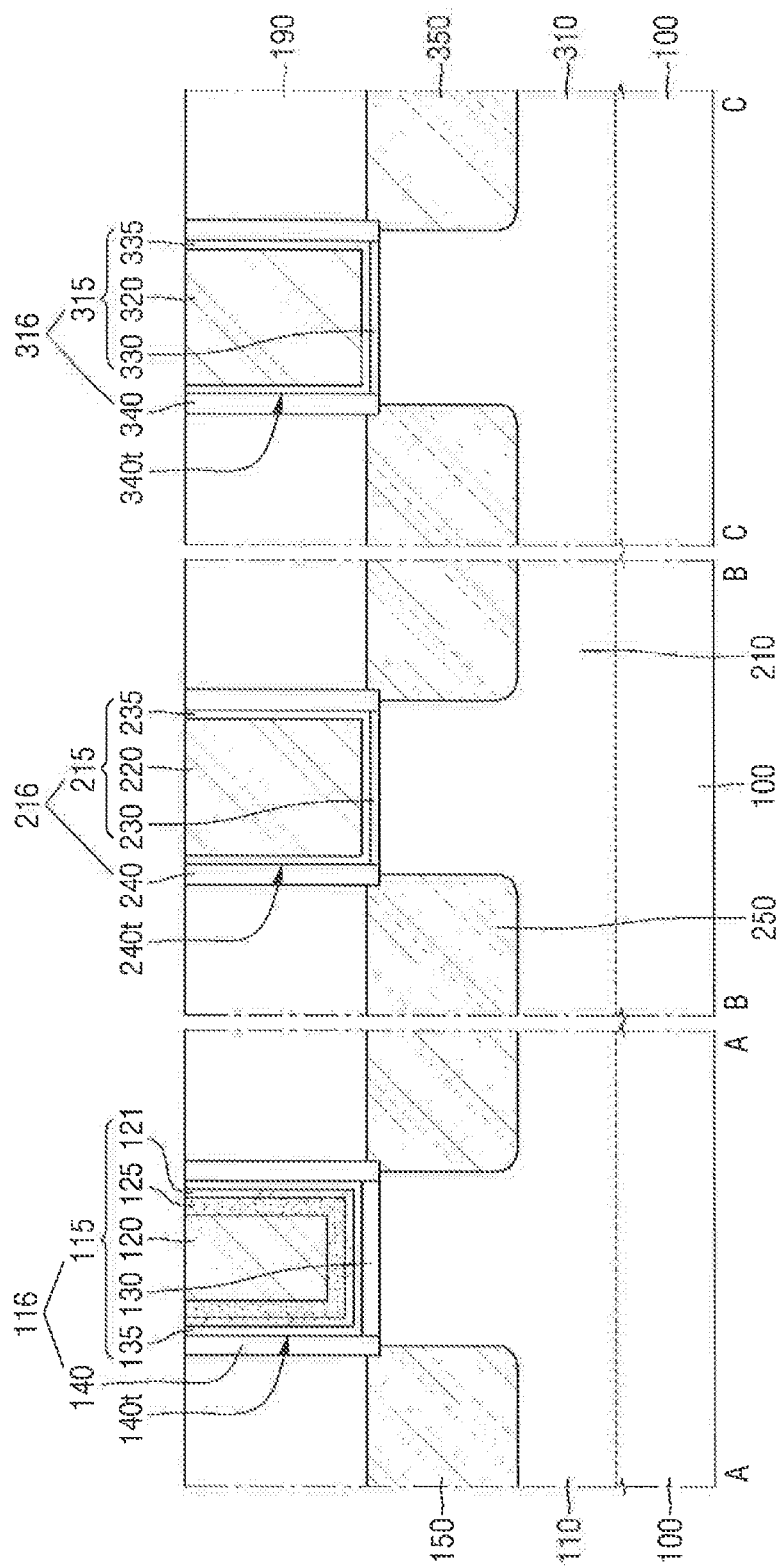
FIG. 7 is a diagram illustrating a semiconductor device according to an exemplary embodiment of the present inventive concept.

FIG. 7 is a diagram illustrating a semiconductor device according to an exemplary embodiment of the present inventive concept. For simplicity of description, the following description will focus on differences from the description with reference to FIGS. 1 to 3, and thus any description that is redundant may be omitted.

Referring to FIG. 7, in a semiconductor device according to an exemplary embodiment of the present inventive concept, the first gate stack 115 may further include a first high-k insulating layer 135 and a first interposing conductive layer 121.

The first high-k insulating layer 135 and the first interposing conductive layer 121 may be formed between the first interfacial layer 130 and the first ferroelectric material layer 125.

The first high-k insulating layer 135 may be formed on the first interfacial layer 130. The first high-k insulating layer 135 may be formed along the sidewalls and the bottom surface of the first gate trench 140t.

The first interposing conductive layer 121 may be formed on the first high-k insulating layer 135. The first interposing conductive layer 121 may be formed along the sidewalk and the bottom surface of the first gate trench 140t.

The first ferroelectric material layer 125 may be formed on the first interposing conductive layer 121.

Figure 8:
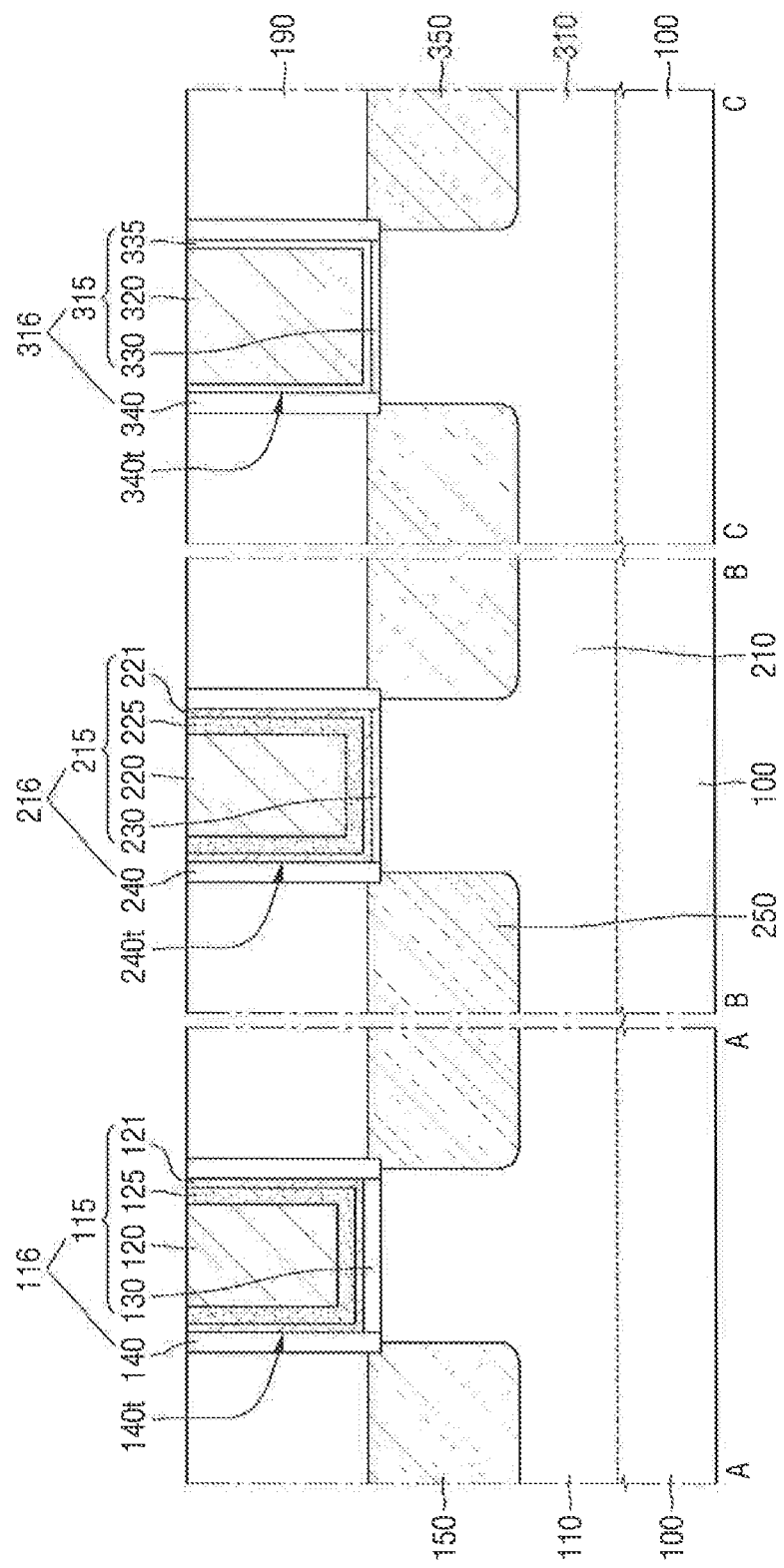
FIG. 8 is a diagram illustrating a semiconductor device according to an exemplary embodiment of the present inventive concept.

FIG. 8 is a diagram illustrating a semiconductor device according to an exemplary embodiment of the present inventive concept. For simplicity of description, the following description will focus on differences from the description with reference to FIG. 4, and thus any description that is redundant may be omitted.

Referring to FIG. 8, in a semiconductor device according to an exemplary embodiment of the present inventive concept, the first gate stack 115 may further include a first interposing conductive layer 121. The second gate stack 215 may further include a second interposing conductive layer 221.

The first interposing conductive layer 121 may be formed between the first interfacial layer 130 and the first ferroelectric material layer 125.

The first interposing conductive layer 121 may be formed on the first interfacial layer 130. The first interposing conductive layer 121 may be formed along the sidewalls and the bottom surface of the first gate trench 140t.

The first ferroelectric material layer 125 may be formed on the first interposing conductive layer 121.

The second interposing conductive layer 221 may be formed between the second interfacial layer 230 and the second ferroelectric material layer 225.

The second interposing conductive layer 221 may be formed on the second interfacial layer 230. The second interposing conductive layer 221 may be formed along the sidewalls and the bottom surface of the second gate trench 240t. For example, the second interposing conductive layer 221 may be disposed between the second gate spacer 240 and the second ferroelectric material layer 225.

The second ferroelectric material layer 225 may be formed on the second interposing conductive layer 221.

Figure 9:
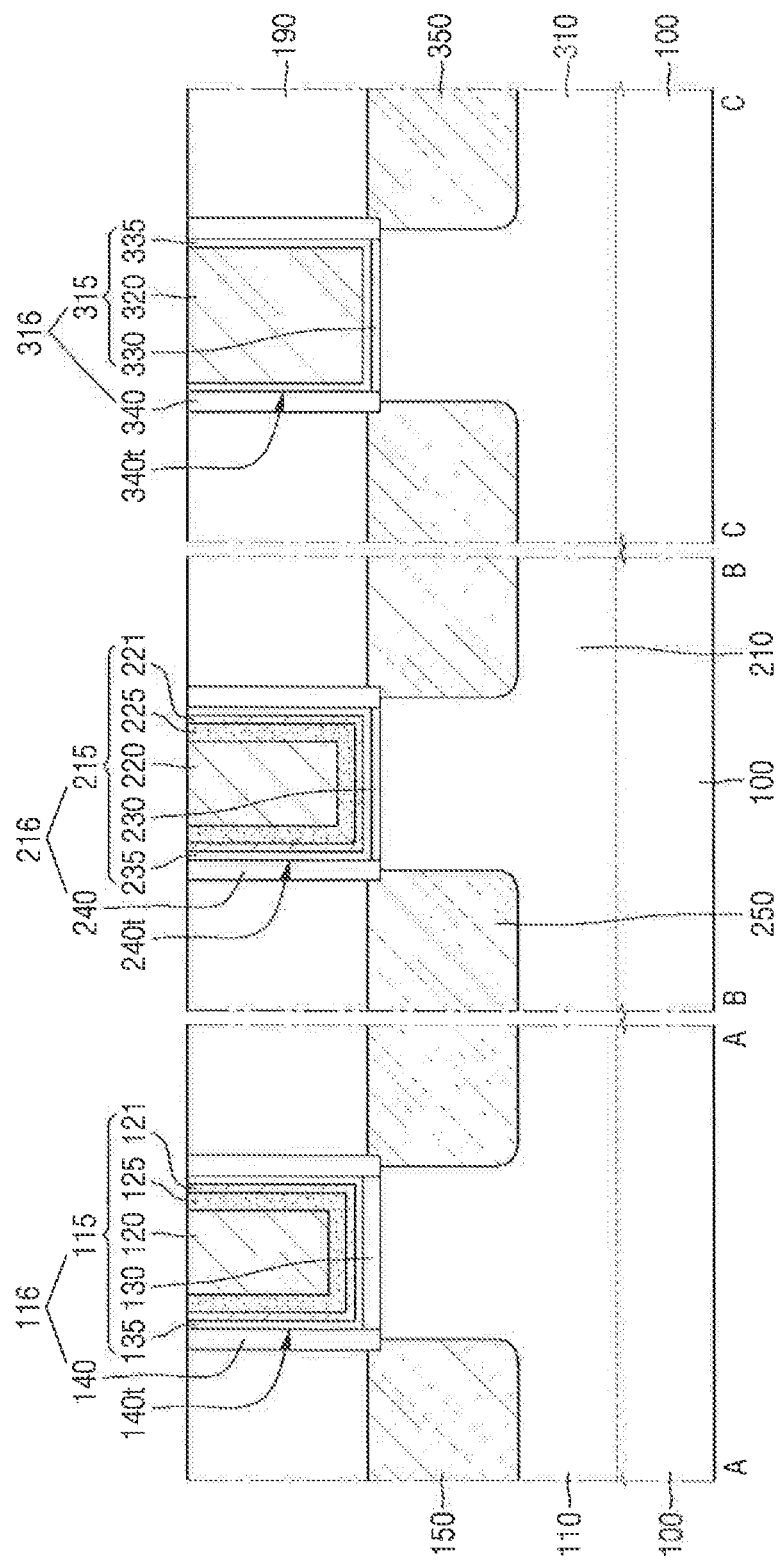
FIG. 9 is a diagram illustrating a semiconductor device according to an exemplary embodiment of the present inventive concept.

FIG. 9 is a diagram illustrating a semiconductor device according to an exemplary embodiment of the present inventive concept. For simplicity of description, the following description will focus on differences from the description with reference to FIG. 8, and thus any description that is redundant may be omitted.

Referring to FIG. 9, in a semiconductor device according to an exemplary embodiment of the present inventive concept, the first gate stack 115 may further include a first high-k insulating layer 135. The second gate stack 215 may further include a second high-k insulating layer 235.

The first high-k insulating layer 135 may be formed between the first interfacial layer 130 and the first interposing conductive layer 121. For example, the first high-k insulating layer 135 is formed between the first interposing conductive layer 121 and the first gate spacer 140. The first high-k insulating layer 135 may be formed along the sidewalk and the bottom surface of the first gate trench 140t.

The second high-k insulating layer 235 may be formed between the second interfacial layer 230 and the second interposing conductive layer 221. For example, the second high-k insulating layer 235 is formed between the second interposing conductive layer 221 and the second gate spacer 240. The second high-k insulating layer 235 may be formed along the sidewalls and the bottom surface of the second gate trench 240t.

Figure 10:
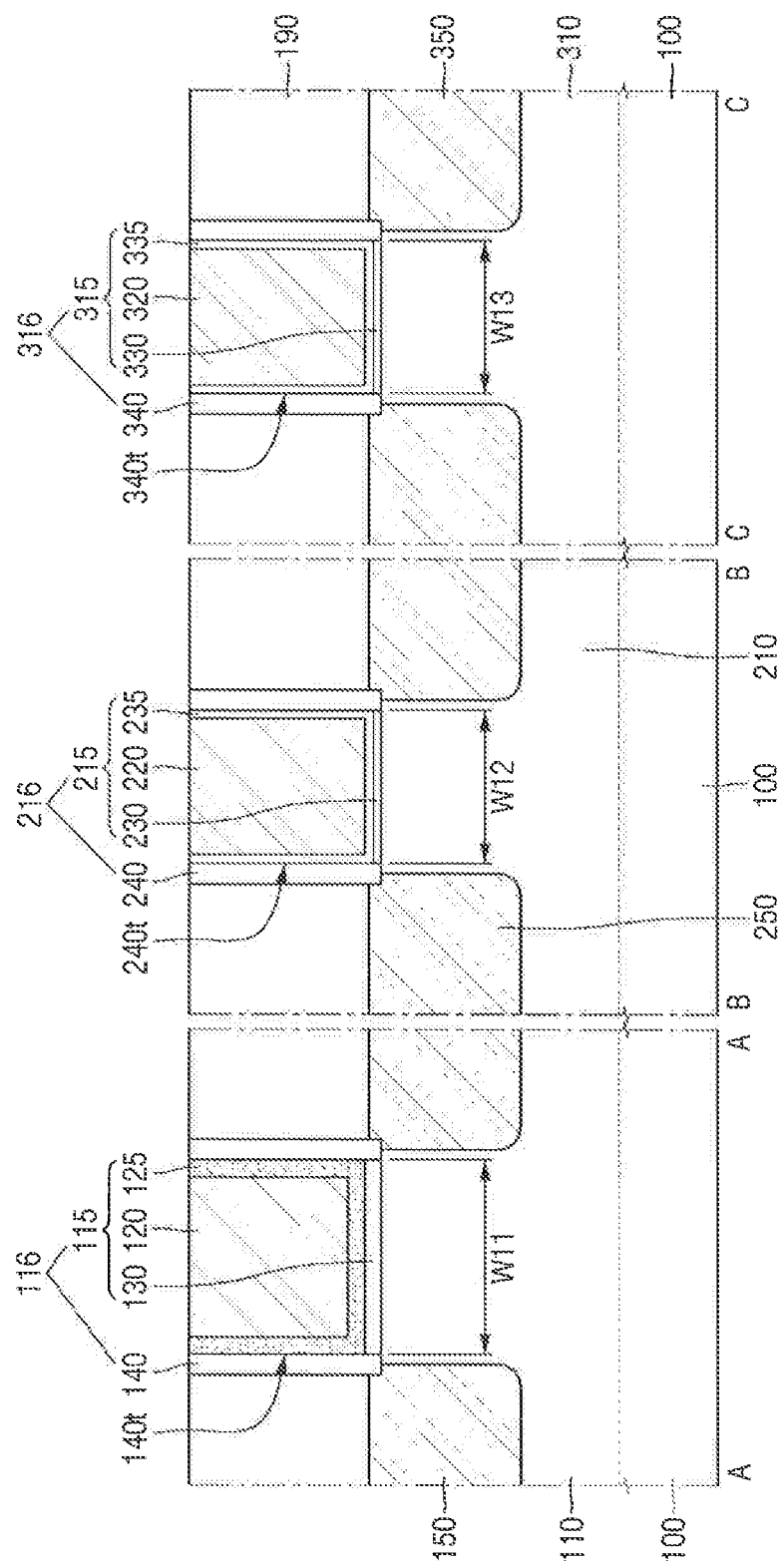
FIG. 10 is a diagram illustrating a semiconductor device according to an exemplary embodiment of the present inventive concept.

FIG. 10 is a diagram illustrating a semiconductor device according to an exemplary embodiment of the present inventive concept. For simplicity of description, the following description will focus on differences from the description with reference to FIGS. 1 to 3, and thus any description that is redundant may be omitted.

Referring to FIG. 10, in a semiconductor device according to an exemplary embodiment of the present inventive concept, a width W11 of the first gate stack 115 in the first direction X1 is different from a width W12 of the second gate stack 215 in the third direction X2 and a width W13 of the third gate stack 315 in the fifth direction X3.

The width W11 of the first gate stack 115 in the first direction X1 is larger than the width W12 of the second gate stack 215 in the third direction X2. The width W11 of the first gate stack 115 in the first direction X1 is larger than the width W13 of the third gate stack 315 in the fifth direction X3.

Figure 11:
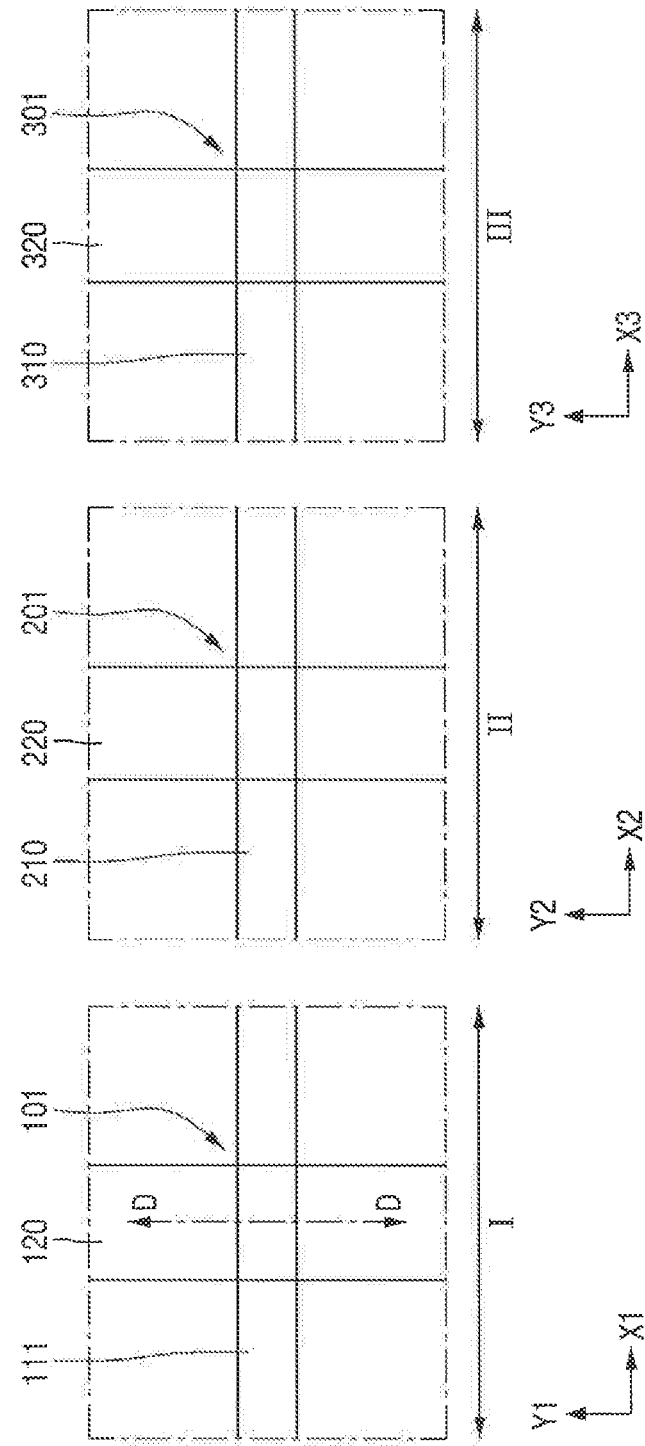
FIG. 11 is a layout diagram illustrating a semiconductor device according to an exemplary embodiment of the present inventive concept.
Figure 12:
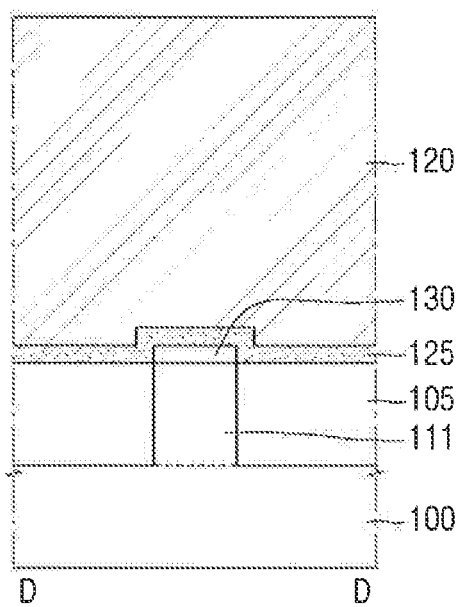
FIG. 12 is a cross-sectional view taken along line D-D of FIG. 11 according to an exemplary embodiment of the present inventive concept.

FIG. 11 is a layout diagram illustrating a semiconductor device according to an exemplary embodiment of the present inventive concept. FIG. 12 is a cross-sectional view taken along line D-D of FIG. 11 according to an exemplary embodiment of the present inventive concept.

Referring to FIGS. 11 and 12, in a semiconductor device according to an exemplary embodiment of the present inventive concept, the first transistor 101 may be a planar transistor.

An active region 111 may be a field insulating layer 105.

A first gate electrode 120 may be formed on the substrate 100 across the active region 111.

According to an exemplary embodiment of the present inventive concept, a semiconductor device may include a negative capacitance field-effect transistor (NCFET) using a gate insulating layer having ferroelectric characteristics to increase the performance of the device.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device, comprising:
a substrate including a first region and a second region;
a first interfacial layer disposed on the substrate in the first region and having a first thickness;
a second interfacial layer disposed on the substrate in the second region, wherein the second interfacial layer has a second thickness that is smaller than the first thickness;
a first gate insulating layer disposed on the first interfacial layer and including a first ferroelectric material layer;
a second gate insulating layer disposed on the second interfacial layer;
a first gate electrode disposed on the first gate insulating layer; and
a second gate electrode disposed on the second gate insulating layer,
wherein the first region is an input/output region, and the second region is a logic region or memory region.

2. The semiconductor device of claim 1, wherein the first interfacial layer is in contact with the first gate insulating layer.

3. The semiconductor device of claim 1, further comprising an interposing conductive layer disposed between the first interfacial layer and the first gate insulating layer.

4. The semiconductor device of claim 1, wherein the second gate insulating layer includes a second ferroelectric material layer.

5. The semiconductor device of claim 4, wherein the first interfacial layer is in contact with the first gate insulating layer, and wherein the second interfacial layer is in contact with the second gate insulating layer.

6. The semiconductor device of claim 4, further comprising
a first interposing conductive layer disposed between the first interfacial layer and the first gate insulating layer; and
a second interposing conductive layer disposed between the second interfacial layer and the second gate insulating layer.

7. The semiconductor device of claim 4, wherein the first ferroelectric material layer is different from the second ferroelectric material layer.

8. The semiconductor device of claim 1, wherein the first gate insulating layer and the second gate insulating layer include a same material.

9. A semiconductor device, comprising:
a substrate including a first region and a second region;
a first gate structure disposed on the substrate in the first region, wherein the first gate structure includes a first gate stack having a first width and a first gate spacer disposed on a sidewall of the first gate stack, Wherein the first gate stack includes a first gate insulating layer including a first ferroelectric material layer; and
a second gate structure disposed on the substrate in the second region, wherein the second gate structure includes a second gate stack having a second width that is smaller than the first width and a second gate spacer disposed on a sidewall of the second gate stack.

10. The semiconductor device of claim 9, wherein the second gate stack includes a second gate insulating layer, and wherein the second gate insulating layer includes a material different from that of the first gate insulating layer.

11. The semiconductor device of claim 10, wherein the first gate stack includes a first interfacial layer disposed between the first gate insulating layer and the substrate, wherein the second gate stack includes a second interfacial layer disposed between the second gate insulating layer and the substrate, wherein the first gate insulating layer is in contact with the first interfacial layer, and wherein the second gate insulating layer is in contact with the second interfacial layer.

12. The semiconductor device of claim 10, wherein the first gate stack farther includes an interposing conductive layer disposed between the first gate insulating layer and the substrate.

13. The semiconductor device of claim 9, wherein the second gate stack includes a second gate insulating layer, and wherein the second gate insulating layer includes a second ferroelectric material layer.

14. The semiconductor device of claim 13, wherein the first gate stuck includes a first interfacial layer disposed between the first gate insulating layer and the substrate, wherein the second gate stack includes a second interfacial layer disposed between the second gate insulating layer and the substrate, wherein the first gate insulating layer is in contact with the first interfacial layer, and wherein the second gate insulating layer is in contact with the second interfacial layer.

15. The semiconductor device of claim 13, wherein the first gate stack further includes a first interposing conductive layer disposed between the first gate insulating layer and the substrate, and wherein the second gate stack further includes a second interposing conductive layer disposed between the second gate insulating layer and the substrate.

16. A semiconductor device, comprising:
a substrate including an input/output (I/O) region and a logic region;
a first negative capacitance field-effect transistor (NCFET) formed in the I/O region and including a first ferroelectric material layer; and
a first transistor formed in the logic region and including a first gate insulating layer.

17. The semiconductor device of claim 16, wherein the first transistor is a second NCFET, and wherein the first gate insulating layer includes a second ferroelectric material layer.

18. The semiconductor device of claim 17, wherein the substrate includes, a memory region, wherein a second transistor including a second gate insulating layer is formed in the memory region, and wherein the second gate insulating layer includes a first high dielectric constant insulating layer.

19. The semiconductor device of claim 16, wherein the first gate insulating layer includes a second high dielectric constant insulating layer.

* * * * *